US011602068B1

(12) United States Patent
Chien et al.

(10) Patent No.: US 11,602,068 B1
(45) Date of Patent: Mar. 7, 2023

(54) CABLE HOLDER FOR AN INFORMATION HANDLING SYSTEM

(71) Applicant: Dell Products L.P., Round Rock, TX (US)

(72) Inventors: Tung Yu Chien, New Taipei (TW); Chi-Chang Fu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 4 days.

(21) Appl. No.: 17/451,381

(22) Filed: Oct. 19, 2021

(51) Int. Cl.
*H05K 7/14* (2006.01)

(52) U.S. Cl.
CPC ......... *H05K 7/1491* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 6,767,237 B1 * | 7/2004 | Shih | .................. | H01R 13/6395 439/373 |
| 7,513,791 B1 * | 4/2009 | Gary | .................. | H01R 13/6395 439/373 |
| 7,695,305 B1 * | 4/2010 | Ray | .................... | H01R 13/6395 439/372 |
| 7,850,478 B2 * | 12/2010 | Lin | .................... | H01R 13/6395 439/372 |
| 10,563,429 B1 * | 2/2020 | Bailey | .................. | E05B 35/008 |
| 2018/0199117 A1 * | 7/2018 | Mankinen | .............. | H04Q 1/064 |
| 2019/0364686 A1 * | 11/2019 | Goergen | ............... | H05K 7/1491 |

FOREIGN PATENT DOCUMENTS

CN            109996418  A  *   7/2019

\* cited by examiner

*Primary Examiner* — James Wu
*Assistant Examiner* — Christopher L Augustin
(74) *Attorney, Agent, or Firm* — McDermott Will & Emery LLP (57) ABSTRACT

In one embodiment, a method for removably coupling a tray bracket to a cable holder of an information handling system includes: receiving, by an open slot of a lock ring receiver of the cable holder, a closed end of a lock ring of the tray bracket, the lock ring receiver disposed on a surface of the cable holder, the closed end of the lock ring removably coupled to the lock ring receiver; applying, by two or more guiding structures of a lock ring neck receptacle of the cable holder, a compression force on a neck of the lock ring; and causing, by the compression force, the neck of the lock ring to be received by a recessed area of the lock ring neck receptable to removably couple the tray bracket to the cable holder.

20 Claims, 5 Drawing Sheets

```
┌─────────────────────────────────────────────────────────────────┐
│  RECEIVE, BY AN OPEN SLOT OF A LOCK RING RECEIVER OF A CABLE    │
│  HOLDER, A CLOSED END OF A LOCK RING OF A TRAY BRACKET.         │
│                              510                                 │
└─────────────────────────────────────────────────────────────────┘
                                │
                                ▼
┌─────────────────────────────────────────────────────────────────┐
│  APPLY, BY TWO OR MORE GUIDING STRUCTURES OF A LOCK RING        │
│  RECEPTACLE OF THE CABLE HOLDER, A COMPRESSION FORCE ON A       │
│  NECK OF THE LOCK RING.                                          │
│                              520                                 │
└─────────────────────────────────────────────────────────────────┘
                                │
                                ▼
┌─────────────────────────────────────────────────────────────────┐
│  CAUSE, BY THE COMPRESSION FORCE, THE NECK OF THE LOCK RING TO  │
│  BE RECEIVED BY A RECESSED AREA OF THE LOCK RING NECK           │
│  RECEPTACLE.                                                     │
│                              530                                 │
└─────────────────────────────────────────────────────────────────┘
```

FIG. 5

CABLE HOLDER FOR AN INFORMATION HANDLING SYSTEM

BACKGROUND

Field of the Disclosure

The disclosure relates generally to information handling systems, and in particular to a cable holder for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed method for removably coupling a tray bracket to a cable holder of an information handling system includes: receiving, by an open slot of a lock ring receiver of the cable holder, a closed end of a lock ring of the tray bracket, the lock ring receiver disposed on a surface of the cable holder, the closed end of the lock ring removably coupled to the lock ring receiver; applying, by two or more guiding structures of a lock ring neck receptacle of the cable holder, a compression force on a neck of the lock ring; and causing, by the compression force, the neck of the lock ring to be received by a recessed area of the lock ring neck receptacle to removably couple the tray bracket to the cable holder.

In one or more of the disclosed embodiments, the method further includes: causing, by the compression force, a decrease in a distance separating a first end and a second end comprising an open end of the lock ring, the open end coupled to a lever of the tray bracket.

In one or more of the disclosed embodiments, the method further includes: receiving, by a first lock ring fastener of the tray bracket, the first end of the open end of the lock ring, the first lock ring fastener disposed proximate to the lever; and receiving, by a second lock ring fastener of the tray bracket, the second end of the open end of the lock ring, the second lock ring fastener disposed proximate to the lever.

In one or more of the disclosed embodiments, the cable holder is disposed proximate to an edge of a chassis of the information handling system, the tray bracket positioned within the chassis proximate to the edge.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes a method for removably coupling a tray bracket to a cable holder of an information handling system that includes: receiving, by an open slot of a lock ring receiver of the cable holder, a closed end of a lock ring of the tray bracket, the lock ring receiver disposed on a surface of the cable holder, the closed end of the lock ring removably coupled to the lock ring receiver; applying, by two or more guiding structures of a lock ring neck receptacle of the cable holder, a compression force on a neck of the lock ring; and causing, by the compression force, the neck of the lock ring to be received by a recessed area of the lock ring neck receptable to removably couple the tray bracket to the cable holder.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Figure 1:
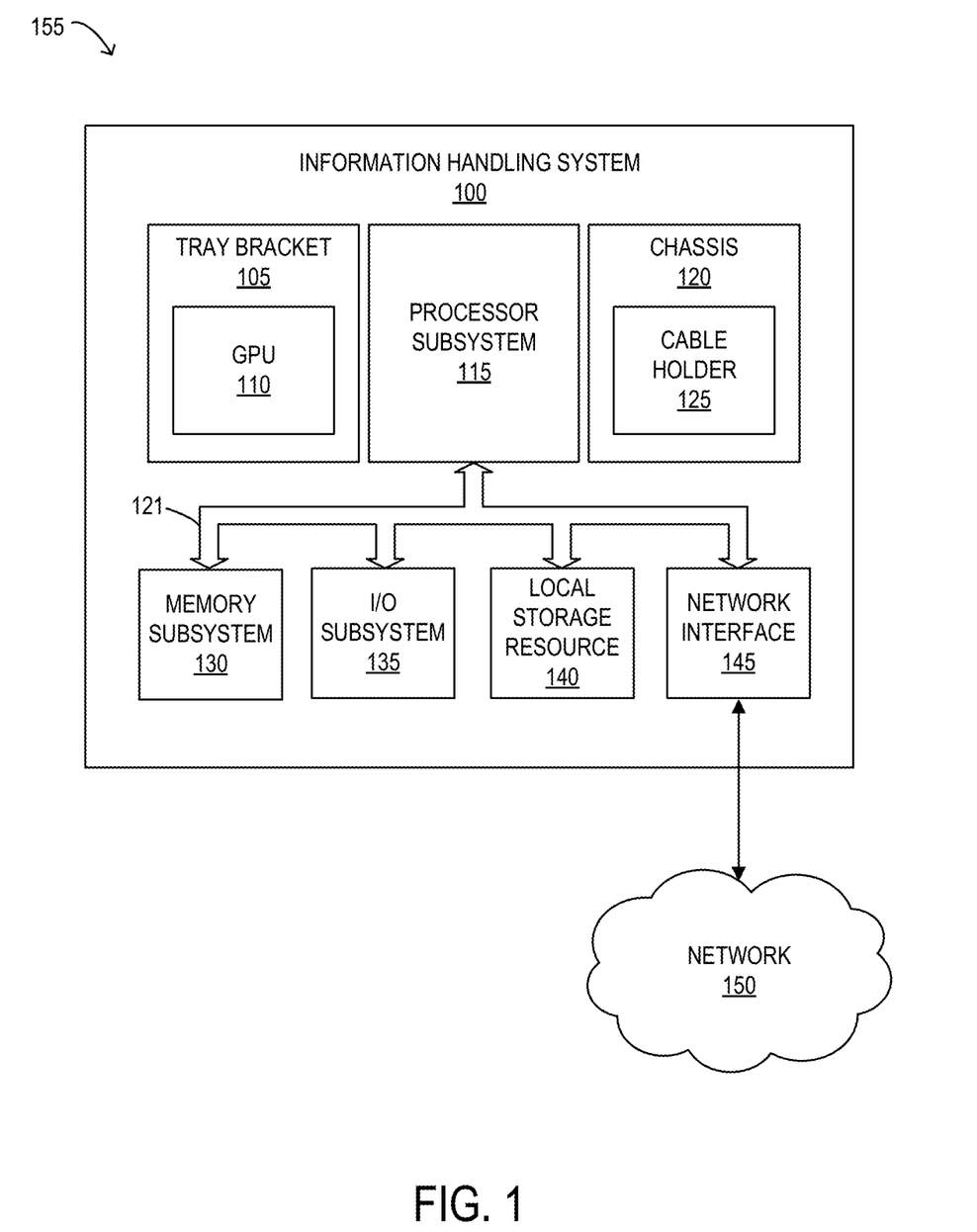
FIG. 1 is a block diagram of selected elements of an embodiment of a computing environment that includes an information handling system.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 115, which may comprise one or more processors, and system bus 121 that communicatively couples various system components to processor subsystem 115 including, for example, a memory subsystem 130, an I/O subsystem 135, a local storage resource 140, and a network interface 145. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include a tray bracket 105, a graphics processing unit (GPU) 110, a chassis 120, and a cable holder 125. In other embodiments, computing environment 155 may include additional, fewer, and/or different components than the components shown in FIG. 1.

In information handling system 100, processor subsystem 115 may comprise a system, device, or apparatus operable to interpret and/or execute program instructions and/or process data, and may include a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 115 may interpret and/or execute program instructions and/or process data stored locally (e.g., in memory subsystem 130 and/or another component of information handling system 100). In the same or alternative embodiments, processor subsystem 115 may interpret and/or execute program instructions and/ or process data stored remotely. In one embodiment, processor subsystem 115 may be or include a multi-core processor comprised of one or more processing cores disposed upon an integrated circuit (IC) chip. In other embodiments, processor subsystem 115 may be or include an integrated device (e.g., microcontroller, system on a chip (SoC), and the like) that includes dedicated memory, peripheral interfaces, and/or other components suitable for interpreting and/or executing program instructions and/or processing data.

In one embodiment, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 135 may comprise a system, device, or apparatus generally operable to receive and/or transmit data to, from, and/or within information handling system 100. I/O subsystem 135 may represent, for example, a variety of communication interfaces, graphics interfaces, video interfaces, user input interfaces, and/or peripheral interfaces. In various embodiments, I/O subsystem 135 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 140 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 145 may be a suitable system, apparatus, or device operable to serve as an interface between information handling system 100 and a network 150. Network interface 145 may enable information handling system 100 to communicate over network 150 using a suitable transmission protocol and/or standard, including, but not limited to, transmission protocols and/or standards enumerated below with respect to the discussion of network 150. Network 150 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), a Cloud network, an Edge network, an intranet, the Internet or another appropriate architecture or system that facilitates the communication of signals, data and/or messages (generally referred to as data). Network interface 145 may enable wired and/or wireless communications (e.g., NFC or Bluetooth) to and/or from information handling system 100.

In particular embodiments, network 150 may include one or more routers for routing data between client information handling systems 100 and server information handling systems 100. A device (e.g., a client information handling system 100 or a server information handling system 100) on network 150 may be addressed by a corresponding network address including, for example, an Internet protocol (IP) address, an Internet name, a Windows Internet name service (WINS) name, a domain name or other system name. In particular embodiments, network 150 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 150 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 150 and its various components may be implemented using hardware, software, or any combination thereof.

In one embodiment, tray bracket 105 may be a suitable system, apparatus, or device operable to mount GPU 110 within information handling system 100. In particular, tray bracket 105 may be or include a rigid material (e.g., metal, steel, and the like) operable to provide a surface upon which GPU 110 may be mounted, or otherwise removably coupled, within chassis 120 of information handling system 100. In one embodiment, tray bracket 105 may include one or more holes disposed upon a surface of tray bracket 105 to receive one or more standoffs used to mount GPU 110 upon the surface of tray bracket 105. In one embodiment, tray bracket 105 may be positioned, or otherwise mounted, within chassis 120 such that tray bracket 105 may be removably coupled to chassis 120. For example, tray bracket 105 may be positioned, or otherwise mounted, within one or more walls of chassis 120. The one or more walls of chassis 120 may extend orthogonally along a perimeter of chassis 120 from the base such that tray bracket 105 is positioned, or otherwise mounted, within the one or more walls of chassis 120.

In one embodiment, tray bracket 105 may be removably coupled to, or otherwise engaged with, chassis 120 proximate to an edge (not shown in figure) of chassis 120. Specifically, tray bracket 105 may include a lock ring (e.g., lock ring 310 shown in FIGS. 3A and 3B) operable to be received by, or otherwise removably couple to, a lock ring receiver (e.g., lock ring receiver 210 shown in FIG. 2) of cable holder 125 disposed proximate to the edge of chassis 120. Tray bracket 105 may additionally include a lever (e.g., lever 300 shown in FIGS. 3A and 3B) operable to apply a downward force (e.g., downward force 410 shown in FIG. 4A) such that lock ring may be received by one or more lock ring fasteners (e.g., lock ring fastener 350 shown in FIG. 3B), thereby removably coupling tray bracket 105 to chassis 120 (i.e., via cable holder 125 of chassis 120). Tray bracket 105 is described in further detail with respect to FIGS. 3A-4B.

In one embodiment, GPU 110 may be a suitable system, apparatus, or device operable to support dedicated graphics for information handling system 100. Specifically, GPU 110 may generate a feed of output images to be displayed to a user of information handling system (e.g., via I/O subsystem 135). In one embodiment, GPU 110 may include a random-access memory (RAM) and power regulators specifically designed for processing video images to offload processing demands on a central processing unit (CPU) (e.g., processor subsystem 115) of information handling system 100 and system RAM (e.g., memory subsystem 130). In one embodiment, GPU 110 may be mounted, or otherwise removably coupled, to a surface of tray bracket 105 as described above. In particular, tray bracket 105 may include one or more holes disposed upon a surface of tray bracket 105 to receive one or more standoffs used to mount GPU 110 upon the surface of tray bracket 105.

In one embodiment, chassis 120 may be a suitable system, apparatus, or device operable to house tray bracket 105 and/or GPU 110. In particular, chassis 120 may be or include a rigid material (e.g., metal, steel, and the like) operable to house tray bracket 105 within one or more walls of chassis 120 as described above. The one or more walls of chassis 120 may extend orthogonally along a perimeter of a base of chassis 120 upon which tray bracket 105 may be positioned, or otherwise mounted, thereby providing housing for tray bracket 105 (and/or GPU 110) within information handling system 100. In the embodiment illustrated in FIG. 1, chassis 120 includes cable holder 125 operable to receive, or otherwise removably couple to, a lock ring (e.g., lock ring 310 shown in FIGS. 3A and 3B) of tray bracket 105. Specifically, cable holder 125 may be disposed proximate to an edge of chassis 120 (i.e., coupled to a wall of the one or more walls of chassis 120) such that tray bracket 105 may be positioned, or otherwise mounted, within chassis 120 proximate to the edge.

In one embodiment, cable holder 125 may be a suitable system, apparatus, or device operable to removably couple tray bracket 105 to chassis 120 of information handling system 100. Specifically, cable holder 125 may be or include a rigid material (e.g., metal, steel, and the like) operable to receive, or otherwise removably couple to, a lock ring (e.g., lock ring 310 shown in FIGS. 3A and 3B) of tray bracket 105 such that tray bracket 105 may be removably coupled to chassis 120 (via cable holder 125). Conventionally, the lock ring of a tray bracket may be received by a cable holder of a chassis such that a downward force applied to a lever of the tray bracket (e.g., by a user and/or manufacturer of information handling system 100) may removably couple the tray bracket to the cable holder. However, due in part to a deviation in respective dimensions between the lock ring and lock ring fasteners (e.g., lock ring fastener 350 shown in FIG. 3B) disposed proximate to the lever of the tray bracket, such downward force may be exceedingly difficult to apply. For example, a user and/or manufacturer of information handling system 100 that wishes to removably couple a tray bracket to a conventional cable holder may be required to apply approximately 167 Newtons (N) of downward force to the lever to removably couple the tray bracket to the conventional cable holder (i.e., via the lock ring). In contrast, cable holder 125 may include a lock ring neck receptacle (e.g., lock ring neck receptacle 200 shown in FIGS. 2-4B) operable to apply an additional compression force on a narrow portion, or a "neck," of the lock ring (e.g., neck 320 shown in FIG. 3B) to cause a width of the neck to narrow in dimension. This narrower dimension may, in turn, cause the deviation in respective dimensions between the lock ring and the lock ring fasteners to diminish, thereby reducing the downward force required to removably couple tray bracket 105 to chassis 120 (via cable holder 125) and increasing overall user experience. Cable holder 125 is described in greater detail with respect to FIGS. 2-4B.

Figure 2:
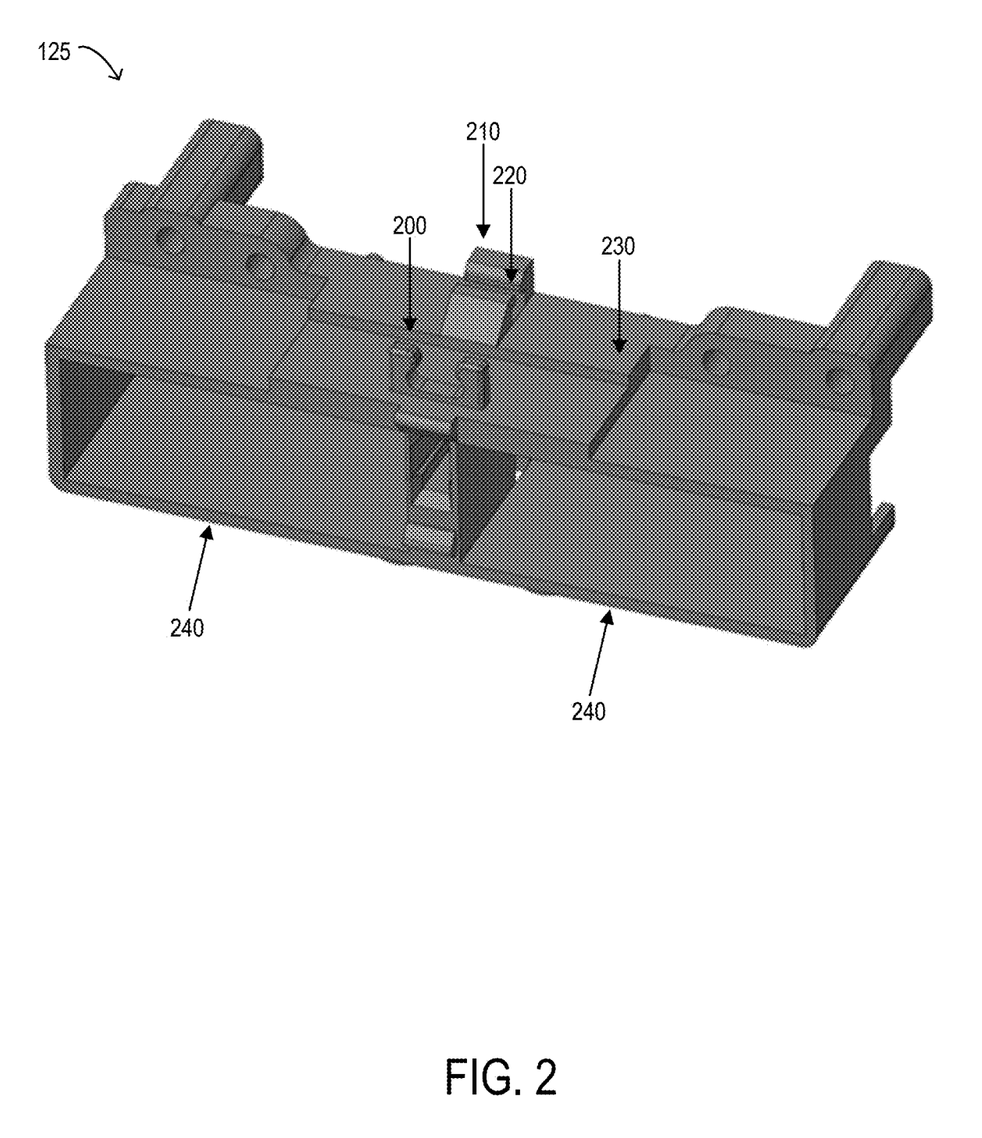
FIG. 2 is a front three-quarter view of selected elements of an embodiment of a cable holder for an information handling system.

FIG. 2 is a front three-quarter view of selected elements of an embodiment of a cable holder for an information handling system. As described above with respect to FIG. 1, cable holder 125 may be disposed proximate to an edge of chassis 120 such that tray bracket 105 may be positioned, or otherwise mounted, within chassis 120 proximate to the edge. In the embodiment illustrated in FIG. 2, cable holder 125 includes a lock ringer receiver 210 and a lock ring neck receptacle 200 disposed on a surface 230 of cable holder 125. Cable holder 125 additionally includes one or more cable routers 240 operable to route one or more cables (e.g., cables of GPU 110) exiting chassis 120. In other embodiments, cable holder 125 may include additional, fewer, and/or different components than the components illustrated in the embodiment shown in FIG. 2.

In one embodiment, lock ring receiver 210 may be a suitable system, apparatus, or device operable to receive a lock ring of tray bracket 105. Specifically, lock ring receiver 210 may be or include a rigid material (e.g., metal, steel, and the like) operable to receive a lock ring of tray bracket 105 via open slot 220 of lock ring receiver 210. For example, open slot 220 may be contoured to receive a closed end (e.g., closed end 360 shown in FIG. 3B) of the lock ring such that the closed end may become removably coupled to lock ring receiver 210, thereby removably coupling tray bracket 105 to cable holder 125. Lock ring receiver 210 is described in further detail with respect to FIGS. 3A-4B.

In one embodiment, lock ring neck receptacle 200 may be a suitable system, apparatus, or device operable to apply a compression force (e.g., compression force 400 shown in FIG. 4A) on a neck of a lock ring (e.g., neck 320 shown in FIG. 3B) of tray bracket 105 to cause a width of the neck of the lock ring to narrow in dimension. As described above with respect to FIG. 1, this narrower dimension may, in turn, cause the deviation in respective dimensions between the lock ring and lock ring fasteners of tray bracket 105 to diminish, thereby reducing the downward force required to removably couple tray bracket 105 to chassis 120 (via cable holder 125). Lock ring neck receptacle 200 is described in further detail with respect to FIGS. 3A-4B.

Figure 3A:
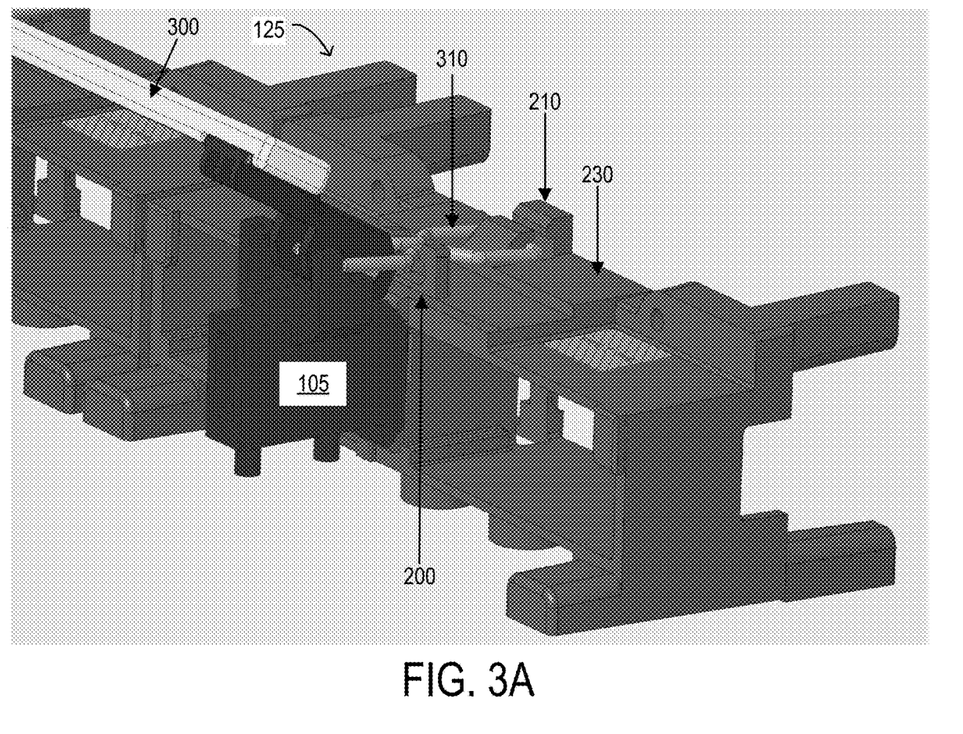
FIGS. 3A and 3B illustrate selected elements of an embodiment of a tray bracket and a cable holder for an information handling system.
Figure 3B:
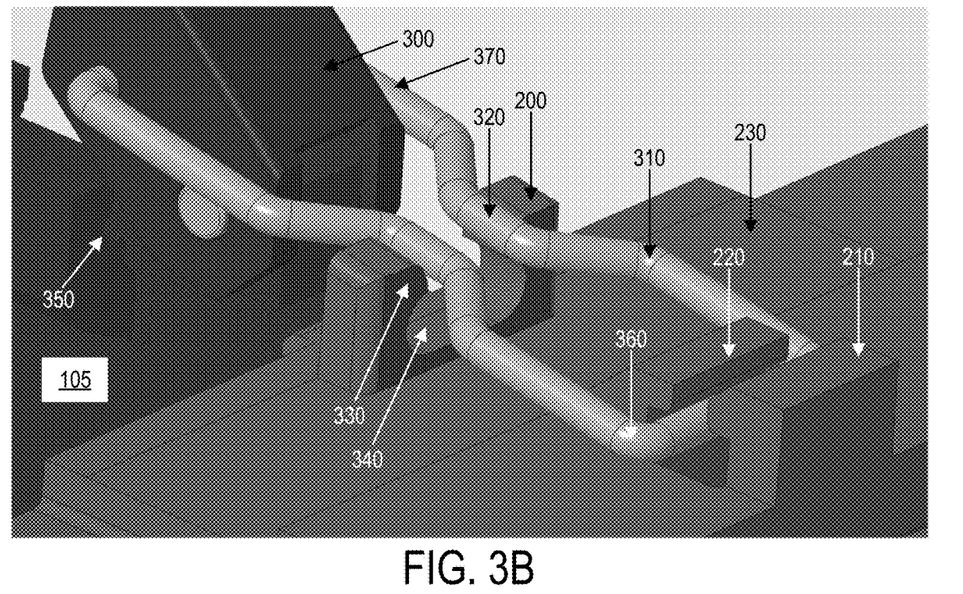

FIGS. 3A and 3B illustrate selected elements of an embodiment of a tray bracket and a cable holder for an information handling system. As described above with respect to FIG. 1, cable holder 125 may be disposed proximate to an edge of chassis 120 such that tray bracket 105 may be positioned, or otherwise mounted, within chassis 120 proximate to the edge. In the embodiment illustrated in FIGS. 3A and 3B, tray bracket 105 includes a lever 300, lock ring fasteners 350, and lock ring 310. Lock ring 310 includes closed end 360, neck 320, and open end 370 coupled to lever 300. Cable holder 125 includes lock ring receiver 210 and lock ring neck receptacle 200 disposed on surface 230 of cable holder 125 as described above with respect to FIG. 2. Lock ring receiver 210 includes open slot 220. Lock ring neck receptacle 200 includes two or more guiding structures 330 disposed proximate to an open end of recessed area 340. In other embodiments, tray bracket 105 and/or cable holder 125 may include additional, fewer, and/or different components than the components illustrated in the embodiment shown in FIGS. 3A and 3B.

In the embodiment illustrated in FIGS. 3A and 3B, lock ring receiver 210 may receive lock ring 310 of tray bracket 105 with lever 300 in an unlocked, or up, position. The unlocked position of lever 300 shown in FIG. 3A may allow lock ring 310 to rotate freely about the base of lever 300 to which lock ring 310 is coupled (i.e., via open end 370) such that lock ring 310 may be received by lock ring receiver 210. Specifically, closed end 360 of lock ring 310—disposed opposite open end 370 of lock ring 310—may be received by open slot 220 of lock ring receiver 210 as shown in FIG. 3B. Once received, closed end 360 of lock ring 310 may be removably coupled to lock ring receiver 210 and neck 320 of lock ring 310 may be positioned above, or partially engaged with, an open end of lock ring neck receptacle 200 as shown in FIG. 3B. In particular, neck 320 of lock ring 310 may be positioned above, or partially engaged with, two or more guiding structures 330 of lock ring neck receptacle 200 disposed proximate to the open end of recessed area 340 of lock ring neck receptacle 200. Neck 320 of lock ring 310 and guiding structures 330 of lock ring neck receptacle 200 are described in further detail with respect to FIGS. 4A and 4B.

Figure 4A:
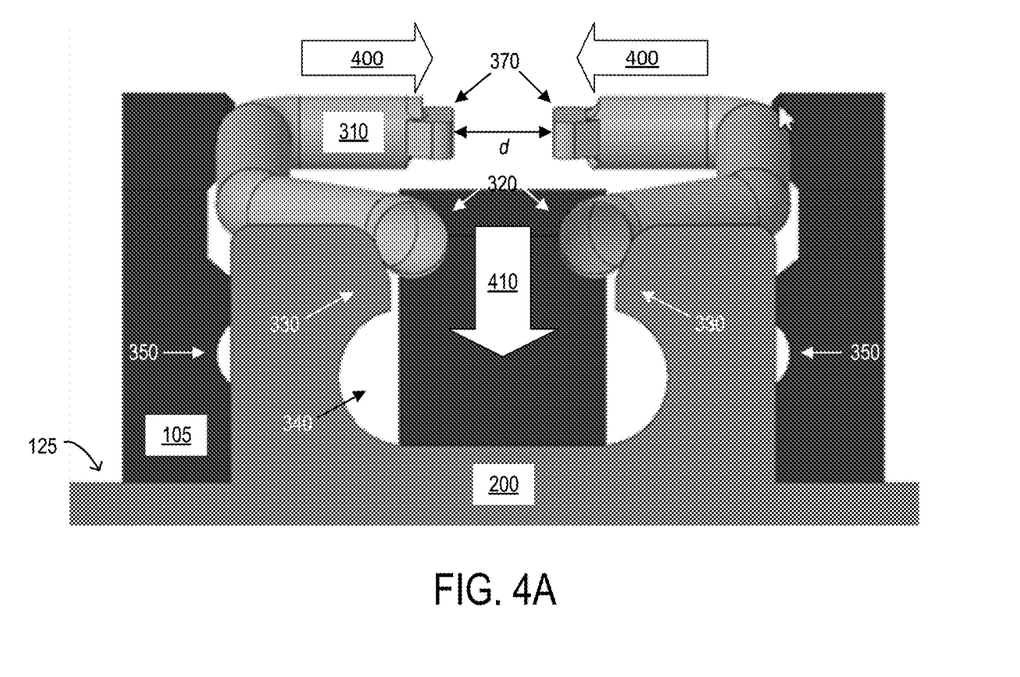
FIGS. 4A and 4B illustrate selected elements of an embodiment of a lock ring of a tray bracket becoming removably coupled to a lock ring neck receptacle of a cable holder.
Figure 4B:
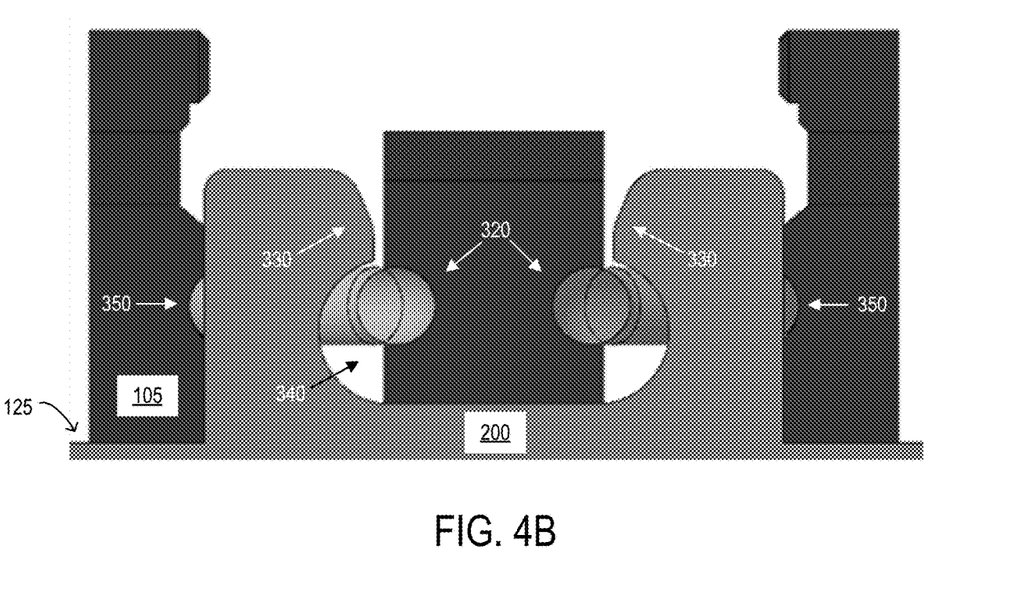

FIGS. 4A and 4B illustrate selected elements of an embodiment of a lock ring of a tray bracket becoming removably coupled to a lock ring neck receptacle of a cable holder. As described above with respect to FIG. 1, cable holder 125 may be disposed proximate to an edge of chassis 120 such that tray bracket 105 may be positioned, or otherwise mounted, within chassis 120 proximate to the edge. In the embodiment illustrated in FIGS. 4A and 4B, tray bracket 105 includes a lever 300 (not shown in figure), lock ring fasteners 350, and lock ring 310. Lock ring 310 includes closed end 360 (not shown in figure), neck 320, and open end 370 coupled to lever 300. Open end 370 includes a first end and a second end separated by a distance d. Cable holder 125 includes lock ring receiver 210 (not shown in figure) and lock ring neck receptacle 200 disposed on surface 230 of cable holder 125 as described above with respect to FIG. 2. Lock ring neck receptacle 200 includes two or more guiding structures 330 disposed proximate to an open end of recessed area 340 as described above with respect to FIGS. 3A and 3B. In other embodiments, tray bracket 105 and/or cable holder 125 may include additional, fewer, and/or different components than the components illustrated in the embodiment shown in FIGS. 4A and 4B.

In the embodiment illustrated in FIGS. 4A and 4B, neck 320 of lock ring 310 may be positioned above, or partially engaged with, an open end of lock ring neck receptacle 200 as shown in FIG. 4A. In particular, neck 320 of lock ring 310 may be positioned above, or partially engaged with, two or more guiding structures 330 of lock ring neck receptacle 200 disposed proximate to the open end of recessed area 340 of lock ring neck receptacle 200. In response to a downward force 410 applied to lever 300 (e.g., by a user and/or manufacturer of information handling system 100), guiding structures 330 of lock ring neck receptacle 200 may apply a compression force 400 on neck 320 of lock ring 310. This is shown in FIG. 4A where downward force 410 may cause neck 320 of lock ring 310 to traverse downward (i.e., toward recessed area 340 of lock ring neck receptacle 200) which, in turn, may cause compression force 400 applied to open end 370 of lock ring 310 to increase in magnitude. In one embodiment, compression force 400 may cause a decrease in the distance d separating the first end and second end of open end 370 of lock ring 310. That is, the distance d separating the first end and the second end may diminish in response to an increased magnitude of compression force 400.

The decrease in distance d caused by compression force 400 may cause the width of neck 320 of lock ring 310 to become narrow in dimension, thereby allowing neck 320 to traverse further downward (i.e., beyond guiding structures 330) into recessed area 340 as shown in FIG. 4B. In particular, the compression force 400 applied by guiding structures 330 on neck 320 of lock ring 310 may cause neck 320 to be received by recessed area 340 of lock ring neck receptacle 200, thereby coupling tray bracket 105 to cable holder 125. Once coupled, the deviation in respective dimensions between lock ring 310 and lock ring fasteners 350 may be diminished as described above with respect to FIG. 1. As such, the downward force 410 required to removably couple tray bracket 105 to chassis 120 (via cable holder 125) may be reduced as open end 370 is received by lock ring fasteners 350. Specifically, downward force 410 may be reduced (e.g., to less than 100 N) allowing a first end of open end 370 to be received by a first lock ring fastener 350 and a second end of open end 370 to be received by a second lock ring fastener 350 as lever 300 is forced downward into a locked, or down, position. This is shown in FIG. 4B where lock ring fasteners 350 have received open end 370 of lock ring 310.

Figure 5:
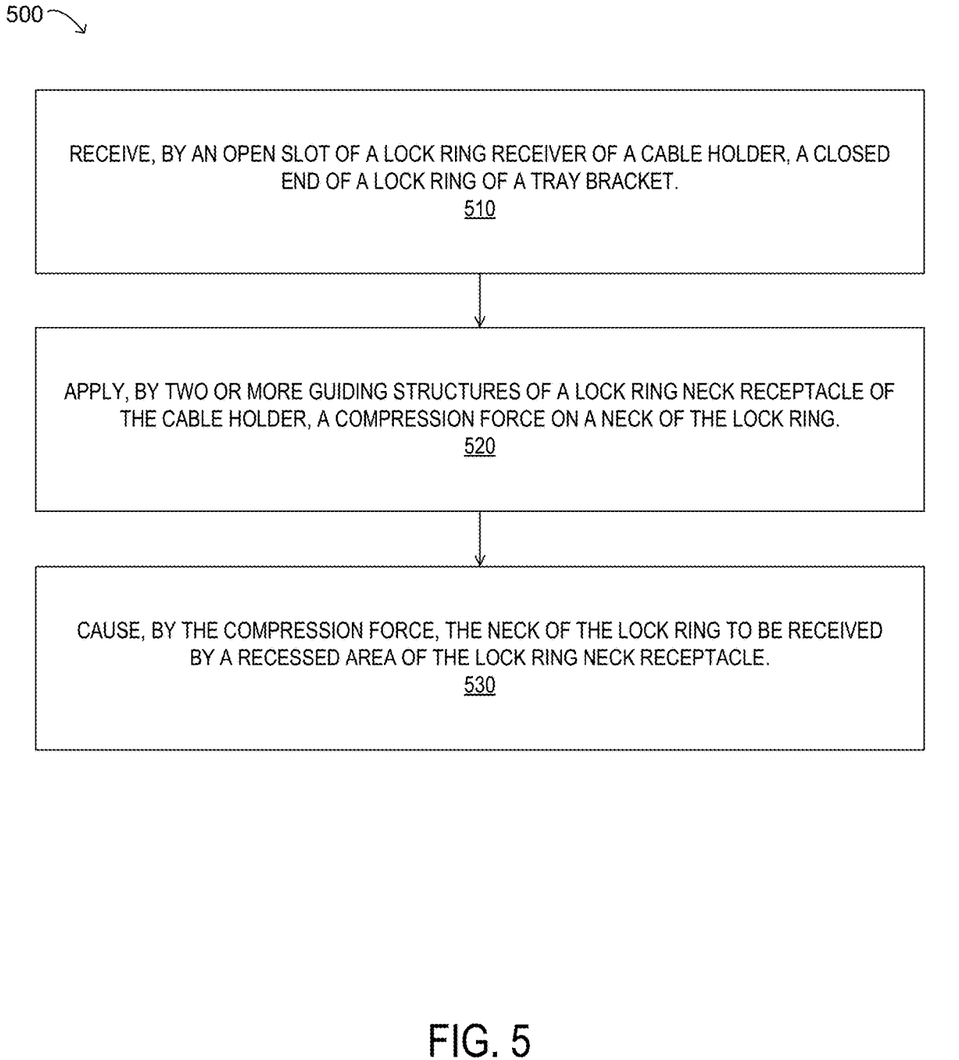
FIG. 5 is a flowchart depicting selected elements of an embodiment of a method for removably coupling a tray bracket to a cable holder of an information handling system.

FIG. 5 is a flowchart depicting selected elements of an embodiment of a method for removably coupling a tray bracket to a cable holder of an information handling system. It is noted that certain operations described in method 500 may be optional or may be rearranged in different embodiments.

Method 500 may begin at step 510, where an open slot of a lock ring receiver of the cable holder may receive a closed end of a lock ring of the tray bracket. The lock ring receiver may be disposed on a surface of the cable holder. The closed end of the lock ring may be removably coupled to the lock ring receiver. For example, closed end 360 of lock ring 310—disposed opposite open end 370 of lock ring 310—may be received by open slot 220 of lock ring receiver 210 as described above with respect to FIG. 3B. Lock ringer receiver 210 may be disposed on a surface 230 of cable holder 125 as described above with respect to FIG. 2. Closed end 360 of lock ring 310 may be removably coupled to lock ring receiver 210 as described above with respect to FIG. 3B. At step 520, two or more guiding structures of a lock ring neck receptacle of the cable holder may apply a compression force on a neck of the lock ring. For example, guiding structures 330 of lock ring neck receptacle 200 may apply a compression force 400 on neck 320 of lock ring 310 as described above with respect to FIG. 4A. At step 530, the compression force may cause the neck of the lock ring to be received by a recessed area of the lock ring neck receptacle to removably couple the tray bracket to the cable holder. For example, compression force 400 applied by guiding structures 330 on neck 320 of lock ring 310 may cause neck 320 to be received by recessed area 340 of lock ring neck receptacle 200, thereby coupling tray bracket 105 to cable holder 125 as described above with respect to FIG. 4B.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
   a tray bracket including a lever;
   a lock ring coupled to the tray bracket, the lock ring including:
     an open end coupled to the lever of the tray bracket;
     a neck; and
     a closed end disposed opposite the open end; and
   a cable holder including:
     a lock ring receiver disposed on a surface of the cable holder, the lock ring receiver having an open slot configured to receive the closed end of the lock ring, the closed end of the lock ring removably coupled to the lock ring receiver;
     a lock ring neck receptacle disposed on the surface of the cable holder, the lock ring neck receptacle having a recessed area including two or more guiding structures configured to apply a compression force on the neck of the lock ring causing the neck of the lock ring to be received by the recessed area to removably couple the tray bracket to the cable holder.

2. The information handling system of claim 1, wherein the open end of the lock ring is comprised of a first end and a second end of the lock ring, the first end and the second end separated by a distance.

3. The information handling system of claim 2, wherein the compression force applied on the neck of the lock ring causes a decrease in the distance separating the first end and the second end comprising the open end of the lock ring.

4. The information handling system of claim 2, wherein the tray bracket further includes a first lock ring fastener and a second lock ring fastener disposed proximate to the lever, the first lock ring fastener configured to receive the first end of the open end of the lock ring, the second lock ring fastener configured to receive the second end of the open end of the lock ring.

5. The information handling system of claim 1, wherein the two or more guiding structures are disposed proximate to an open end of the recessed area of the lock ring neck receptacle.

6. The information handling system of claim 1, wherein the compression force on the neck of the lock ring is applied by the two or more guiding structures in response to a downward force applied to the lever of the tray bracket.

7. The information handling system of claim 1, wherein the compression force on the neck of the lock ring causes a width of the neck of the lock ring to narrow.

8. The information handling system of claim 1, wherein the cable holder is disposed proximate to an edge of a chassis of the information handling system, the tray bracket positioned within the chassis proximate to the edge.

9. A method for removably coupling a tray bracket to a cable holder of an information handling system, the method comprising: receiving, by an open slot of a lock ring receiver of the cable holder, a closed end of a lock ring of the tray bracket, the lock ring receiver disposed on a surface of the cable holder, the closed end of the lock ring removably coupled to the lock ring receiver; applying, by two or more guiding structures of a lock ring neck receptacle of the cable holder, a compression force on a neck of the lock ring; and causing, by the compression force, the neck of the lock ring to be received by a recessed area of the lock ring neck receptacle to removably couple the tray bracket to the cable holder.

10. The method of claim 9, further comprising: causing, by the compression force, a decrease in a distance separating a first end and a second end comprising an open end of the lock ring, the open end coupled to a lever of the tray bracket.

11. The method of claim 10, further comprising:
receiving, by a first lock ring fastener of the tray bracket, the first end of the open end of the lock ring, the first lock ring fastener disposed proximate to the lever; and
receiving, by a second lock ring fastener of the tray bracket, the second end of the open end of the lock ring, the second lock ring fastener disposed proximate to the lever.

12. The method of claim 9, wherein the cable holder is disposed proximate to an edge of a chassis of the information handling system, the tray bracket positioned within the chassis proximate to the edge.

13. A cable holder for an information handling system, comprising:
a lock ring receiver disposed on a surface of the cable holder, the lock ring receiver having an open slot configured to receive a closed end of a lock ring of a tray bracket of the information handling system, the closed end of the lock ring removably coupled to the open slot; and
a lock ring neck receptacle disposed on the surface of the cable holder, the lock ring neck receptacle having a recessed area including two or more guiding structures configured to apply a compression force on a neck of the lock ring causing the neck of the lock ring to be received by the recessed area to removably couple the tray bracket to the cable holder.

14. The cable holder of claim 13, wherein the tray bracket includes an open end of the lock ring, the open end comprised of a first end and a second end of the lock ring, the first end and the second end separated by a distance.

15. The cable holder of claim 14, wherein the compression force applied on the neck of the lock ring causes a decrease in the distance separating the first end and the second end comprising the open end of the lock ring.

16. The cable holder of claim 14, wherein the tray bracket further includes a first lock ring fastener and a second lock ring fastener disposed proximate to a lever, the first lock ring fastener configured to receive the first end of the open end of the lock ring, the second lock ring fastener configured to receive the second end of the open end of the lock ring.

17. The cable holder of claim 13, wherein the two or more guiding structures are disposed proximate to an open end of the recessed area of the lock ring neck receptacle.

18. The cable holder of claim 13, wherein the compression force on the neck of the lock ring is applied by the two or more guiding structures in response to a downward force applied to a lever of the tray bracket.

19. The cable holder of claim 13, wherein the compression force on the neck of the lock ring causes a width of the neck of the lock ring to narrow.

20. The cable holder of claim 13, wherein the cable holder is disposed proximate to an edge of a chassis of the information handling system, the tray bracket positioned within the chassis proximate to the edge.

* * * * *